(12) United States Patent
Motabar

(10) Patent No.: US 8,760,197 B2
(45) Date of Patent: Jun. 24, 2014

(54) ROBUST GLITCH-FREE CLOCK SWITCH WITH AN UNATE CLOCK NETWORK

(75) Inventor: Iraj Motabar, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 99 days.

(21) Appl. No.: 13/074,689

(22) Filed: Mar. 29, 2011

(65) Prior Publication Data

US 2012/0249194 A1    Oct. 4, 2012

(51) Int. Cl.
*G06F 1/08* (2006.01)
(52) U.S. Cl.
USPC .............................. 327/99; 327/298; 327/407
(58) Field of Classification Search
USPC .................................... 327/99, 298, 407–413
See application file for complete search history.

(56) References Cited

U.S. PATENT DOCUMENTS

| | | | | |
|---|---|---|---|---|
| 4,853,653 A * | 8/1989 | Maher | | 331/49 |
| 4,870,299 A * | 9/1989 | Chen | | 327/99 |
| 5,315,181 A * | 5/1994 | Schowe | | 326/93 |
| 6,456,146 B1 * | 9/2002 | Darmon et al. | | 327/407 |
| 6,563,349 B2 * | 5/2003 | Menezes et al. | | 327/99 |
| 6,600,345 B1 * | 7/2003 | Boutaud | | 327/99 |
| 6,795,932 B2 * | 9/2004 | Ohkawa | | 713/600 |
| 7,046,047 B2 * | 5/2006 | Daijo | | 327/99 |
| 7,471,120 B2 * | 12/2008 | Lou | | 327/99 |
| 2009/0315597 A1 * | 12/2009 | Kallam | | 327/144 |
| 2010/0001767 A1 * | 1/2010 | Shikata | | 327/99 |

* cited by examiner

*Primary Examiner* — Patrick O'Neill
(74) *Attorney, Agent, or Firm* — Sterne, Kessler, Goldstein & Fox P.L.L.C.

(57) ABSTRACT

A system, method, and computer program product are provided for the switching of clock signals. A clock network switching system includes a first re-synchronization circuit coupled to a first input clock, and a second re-synchronization circuit coupled to a second input clock. There is also an input select decoder coupled to the first and second re-synchronization circuit that can dynamically select either the first or the second input clock to be active. When an input clock is selected to be active, the re-synchronization circuit associated with the selected input clock generates an output clock synchronized with the selected input clock where both a high pulse width and a low pulse width of the output clock are not less than those of the selected input clock.

18 Claims, 7 Drawing Sheets

(Conventional Clock Switching Timing Diagram)

ROBUST GLITCH-FREE CLOCK SWITCH WITH AN UNATE CLOCK NETWORK

BACKGROUND

1. Field

Embodiments generally relate to electronic signal switching.

2. Background

Current switching systems for clock networks typically involve the use of a multiplexer. However, such systems have the possibility of generating glitches, or shortened pulses during the switching process. Such glitches occur when switching from a clock signal too soon during a clock pulse. If the generated glitch is small enough the glitch can cause a processor lock-up or other problems such as a memory failure.

Typical switching systems usually require that the state of the clock signals to be switched are known in simulation. Further, the clock signals to be switched have to be running thereby requiring power when the clock signal may not be necessary for some amount of time.

BRIEF SUMMARY

Therefore, what is needed is a system and method for clock network switching without producing glitches that can cause system failures. Further, the ability to accommodate unknown clock states and to control whether clock signals can shut off for a certain period allows for more efficient circuit operation and lower power consumption.

A system, method, and computer program product for clock signal switching is provided. In an embodiment there is provided a clock network switching system that includes a first re-synchronization circuit coupled to a first input clock, and a second re-synchronization circuit coupled to a second input clock. There is also an input select decoder coupled to the first and second re-synchronization circuit that can dynamically select either the first or the second input clock to be active. When an input clock is selected to be active, the re-synchronization circuit associated with the selected input clock generates an output clock synchronized with the selected input clock where both a high pulse width and a low pulse width of the output clock are not less than those of the selected input clock.

In a further embodiment, there is provided a method for clock signal switching that includes receiving a first and a second input clock and then dynamically selecting the second input clock to be active. The method continues by generating an output clock that is synchronized with the dynamically selected second input clock where both a high pulse width and a low pulse width of the output clock are not less than those of the selected second input clock. The method can optionally include generating an output clock that is synchronized with the first input clock prior to the dynamic selecting of the second input clock to be active where the generation is delayed from the time of dynamically selecting the second input clock. In an embodiment, the delay is equal to two clock cycles of the first input clock plus two clock cycles of the second input clock.

In a further embodiment, there is provided a computer program product, including a non-transitory computer readable storage medium with computer readable program code for clock signal switching. The computer readable program code includes program code that causes the computer to receive a first and a second input clock. The program code causes the computer to dynamically select the second input clock to be active and to generate an output clock that is synchronized with the dynamically selected second input clock where both a high pulse width and a low pulse width of the output clock are not less than those of the selected second input clock.

Further embodiments and features, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the information contained herein.

BRIEF DESCRIPTION OF THE DRAWINGS/FIGURES

Embodiments of the invention will now be described, by way of example only, with reference to the accompanying drawings in which corresponding reference symbols indicate corresponding parts. Further, the accompanying drawings, which are incorporated herein and form part of the specification, illustrate embodiments, and, together with the description, further serve to explain the principles of the invention and to enable a person skilled in the relevant art(s) to make and use the invention.

Figure 1:
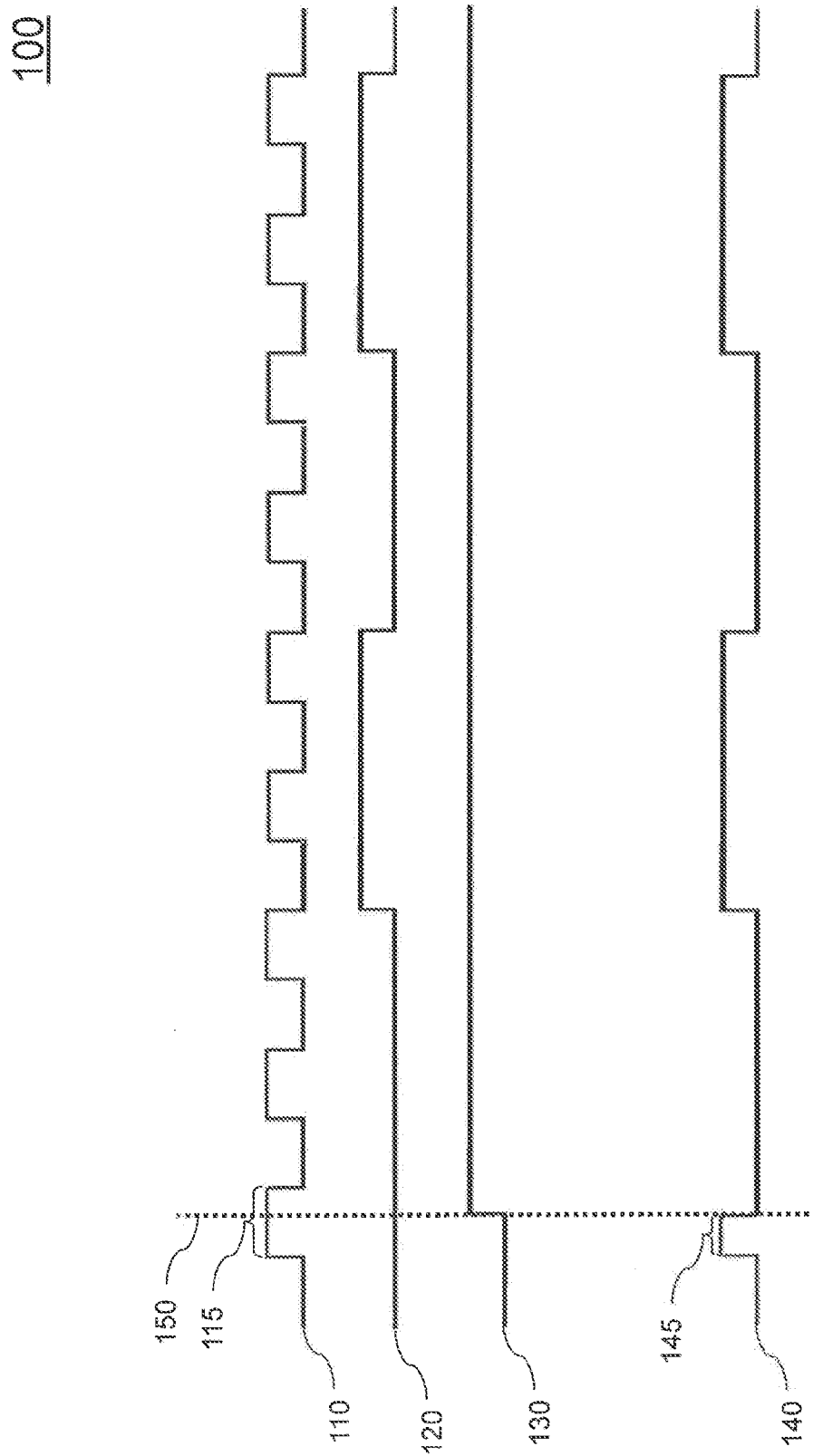
FIG. 1 illustrates a set of timing diagrams associated with a conventional clock network switching system.

The features of various embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

While embodiments described herein are illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The embodiments described herein are referred in the specification as "one embodiment," "an embodiment," "an example embodiment," etc. These references indicate that the embodiment(s) described can include a particular feature, structure, or characteristic, but every embodiment does not necessarily include every described feature, structure, or characteristic. Further, when a particular feature, structure, or characteristic is described in connection with an embodiment, it is understood that it is within the knowledge of one skilled in the art to affect such feature, structure, or characteristic in connection with other embodiments whether or not explicitly described.

FIG. 1 illustrates a timing diagram 100 for a conventional clock switching. In the example shown in FIG. 1, timing diagram 100 includes a timing diagram for first clock 110, a timing diagram for second clock 120, a timing diagram for a select signal 130, and a timing diagram for an output 140 of a clock switching system.

Timing diagram 100 is associated with a conventional multiplexer based switching system, not shown, for switching between first clock 110 and second clock 120. Select signal 130 is associated with first clock 110 where when select signal 130 is low, first clock 110 is selected and its signal is passed to the output of the multiplexer based switching system. Time mark 150 illustrates the point in time when select signal goes high and "deselects" or disables first clock 110. At the same time first clock 110 is disabled, second clock 120 is enabled. In this embodiment, at time line 115, output 140 is driven low as first clock 110 is disabled and second clock 120 is selected, where the state of second clock 120 is low. In this example, first clock 110 is disabled in the middle of a pulse and therefore the full duty cycle of clock 110, shown as duty cycle 115, is reduced in output 140 to a shorter duration duty cycle 145. If select signal 130 went to a high state earlier in the cycle of clock 110, then the duty cycle 145 would be even shorter. As the duration of a signal, e.g., pulse width, at the time of switching from one clock signal to another becomes shorter, the resulting output signal approaches becoming a narrow glitch type signal. Such glitch signals cause computer system lock-ups and device failures. As such, the situation shown in FIG. 1 is to be avoided and is addressed in the following embodiments.

Figure 2:
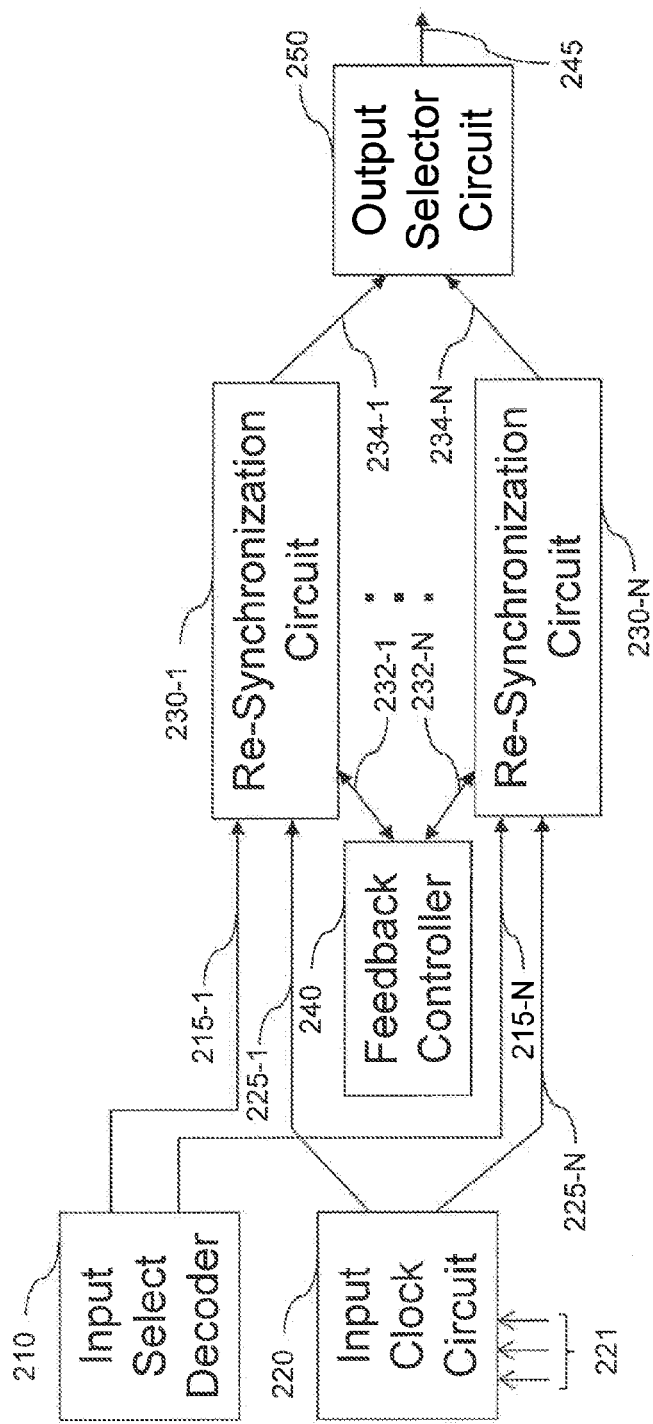
FIG. 2 illustrates a functional design of a clock switching system, according to an embodiment.

FIG. 2 illustrates a functional design of clock switching system 200, according to an embodiment. In the example shown in FIG. 2, clock-switching system 200 includes an input select decoder 210, an input clock circuit 220, re-synchronization circuits 230-1 through 230-N, and an output selector circuit 250.

Input select decoder 210, in an embodiment, controls which re-synchronization circuit is active, e.g., re-synchronization circuit 230-1 through 230-N, where N is an integer value of 2 or greater. Input select decoder 210 is coupled to each re-synchronization circuit 2304 through 230-N through control lines 215-1 through 215-N (also referred to as input select signals 215-1 through 215-N), respectively. Only one re-synchronization circuit 230 can be active, e.g., in control, at any one time. This type of control where only one system is active is also referred to as an onecool disable. Input select decoder 210 may also be referred to as a disable controller, disabling all re-synchronization circuits 230 except fix the one re-synchronization circuit 230 that is active. As will be explained in more detail later, an active re-synchronization circuit 230 allows a selected input clock signal to propagate through the active re-synchronization circuit 230 to output selector circuit 250.

Input clock circuit 220, in an embodiment, controls clock signals on lines 225-1 through 225-N (also referred to as input clocks 225-1 through 225-N) that are sent to each respective re-synchronization circuit 230. Clock signals on lines 225 do not have to be of the same duty cycle, frequency, phase or any other signal characteristic compared to other clock signals. In addition, a clock signal can be turned off, e.g., floating, or held in a constant state, e.g., high or low, or be inverted. In an embodiment, input clock circuit 220 generates one or more of the clock signals having different duty cycles. In another embodiment, input clock circuit 220 accepts clock signals from other sources. Input clock circuit 220 can also accept commands, e.g., commands 221, from other sources that determines which clock signals are assigned to which line 225, as well as other characteristics of the clock signals, e.g., active, standby, floating, amplitude, frequency, etc. Input clock circuit 220 also has the ability to place a clock signal into a standby mode to save system power, and wake the clock signal from the standby mode prior to being input to a selected re-synchronization circuit 230, based on commands, such as commands 221 shown in FIG. 2.

Re-synchronization circuit 230 controls whether a clock signal on line 225 is active or masked. If a re-synchronization circuit 230 is selected by input select decoder 210, then re-synchronization circuit 230 will re-synchronize its input clock signal. Re-synchronization of an input clock signal is where an associated output clock signal is generated that is in-sync with the input clock signal and where both the high and the low pulse widths of the output clock signal are not less than those of the corresponding input clock signal. Such re-synchronizing eliminates the generation of glitches as referenced above.

Feedback controller 240 monitors the outputs of re-synchronization circuits 230, e.g., 234-1 through 234-N, and ensures that only one re-synchronization circuit 230 is active at any particular time by masking the outputs of other non-active re-synchronization circuits 230, in other words, thereby only allowing a single clock signal on line 225 from the active resynchronization circuit 230 to be active. The monitoring and control of re-synchronization circuits 230 is illustrated by bi-directional lines 232-1 through 232-N. Feedback controller 240 is illustrated in further detail in FIG. 4, e.g., feedback signals 435 and 445, and in FIG. 6, e.g., feedback signal 635.

Output selector circuit 250 combines the outputs from re-synchronization circuits 230-1 through 230-N and only allows the output signal from the one selected re-synchronization circuit to pass through to output 245.

Figure 3:
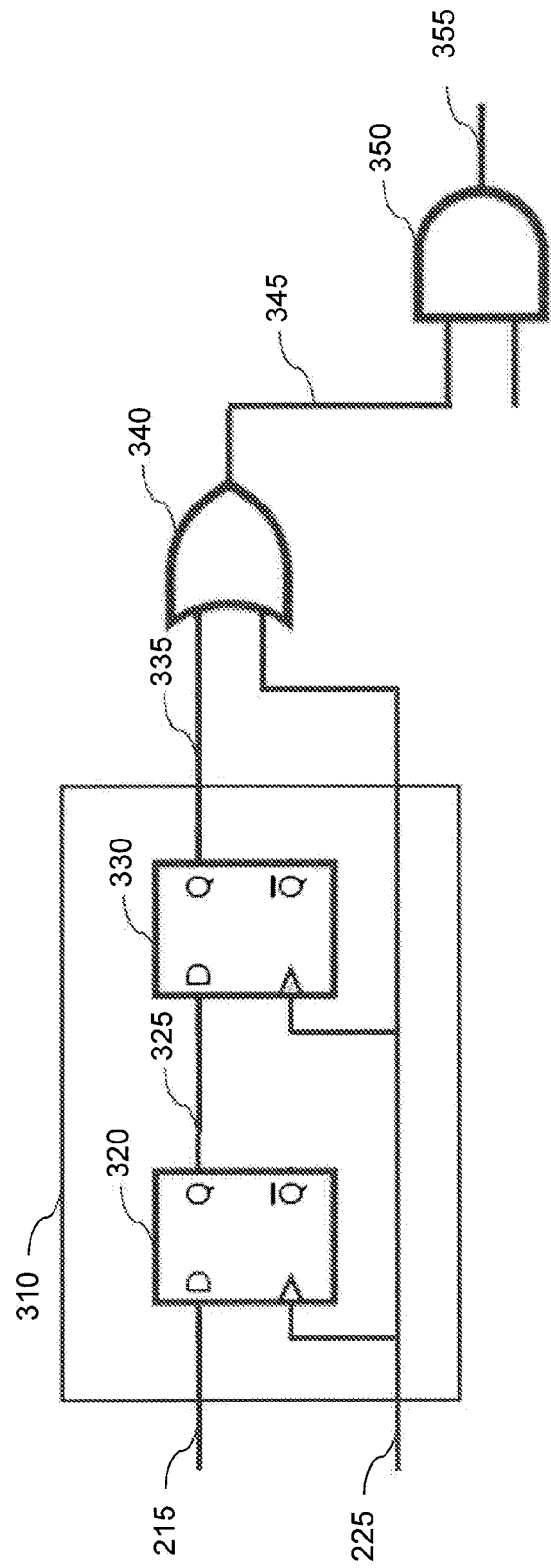
FIG. 3 illustrates a detail implementation of a re-synchronization circuit, according to an embodiment.

FIG. 3 illustrates an implementation of a clock switching system 300 with a more detail view of a re-synchronization circuit, according to an embodiment. In the example shown in FIG. 3, clock switching system 300 includes a re-synchronization circuit 310, an OR gate 340, and an output AND gate 350.

Re-synchronization circuit 310, in an embodiment, includes data or delay flip-flops 320 and 330. Re-synchronization circuit 310 can be designed with additional or different types of flip-flops, e.g., flip-flops with a set and reset, as would be obvious to one of ordinary skill in the art. In this embodiment, the following logic truth table controls the operation of flip-flops 320 and 330.

TABLE 1

| Clock | D | Q | $Q_{prev}$ |
| --- | --- | --- | --- |
| Rising edge | 0 | 0 | X |
| Rising edge | 1 | 1 | X |
| Non-Rising | X | $Q_{prev}$ | |

("X" denotes a "don't care" condition, meaning the signal is irrelevant)

Re-synchronization circuit 310 receives input select signal 215 from input select decoder 210, and input clock 225, as previously described in FIG. 2. Tables 2 and 3 below illustrate, in an embodiment, disablement and enablement of the input clock signal 225 using the input clock signal 215. In Tables 2 and 3: line 215 is the input state to flip-flop 320; line 325 is the Q output of flip-flop 320 and the input state to flip-flop 330; line 335 is the Q output of flip-flop 330 and the input state to OR gate 340; line 345 is the output state of OR gate 340.

More specifically, table 2 shows the propagation of a clock signal applied to the clock input 225 of re-synchronization circuit 310 and OR gate 340 when the input select signal 215 is high, which causes the input clock 225 to be disabled, as it does not reach the output of OR gate 340 after two clock cycles.

TABLE 2

| Clock State 225 | 215 | 325 | 335 | 345 |
|---|---|---|---|---|
| 0 | 1 | $Q_{prev}$ | $Q_{prev}$ | $Q_{prev}$ |
| 1 | 1 | 1 | $Q_{prev}$ | 1 |
| 0 | 1 | 1 | $Q_{prev}$ | $Q_{prev}$ |
| 1 | 1 | 1 | 1 | 1 |
| 0 | 1 | 1 | 1 | 1 |
| 1 | 1 | 1 | 1 | 1 |
| 0 | 1 | 1 | 1 | 1 |
| 1 | 1 | 1 | 1 | 1 |

As shown above in table 2, the output of OR gate 340 on line 345 remains in a high state after two rising clock inputs, regardless of input clock 225 state, and therefore the input clock signal is disabled. This is true because input select signal 215 is high, so that the OR gate 340 will output a constant high, once input select signal 215 (high) propagates through the flip-flops 320, 330.

Table 3 below shows the propagation of a clock signal applied to the clock input of re-synchronization circuit 310 and OR gate 340 when input select signal 215 is low, which causes the input clock 225 to be enabled, as it is passed to output of OR gate 340 after two clock cycles.

TABLE 3

| Clock State 225 | 215 | 325 | 335 | 345 |
|---|---|---|---|---|
| 0 | 0 | $Q_{prev}$ | $Q_{prev}$ | $Q_{prev}$ |
| 1 | 0 | 0 | $Q_{prev}$ | 1 |
| 0 | 0 | 0 | $Q_{prev}$ | $Q_{prev}$ |
| 1 | 0 | 0 | 0 | 1 |
| 0 | 0 | 0 | 0 | 0 |
| 1 | 0 | 0 | 0 | 1 |
| 0 | 0 | 0 | 0 | 0 |
| 1 | 0 | 0 | 0 | 1 |

As shown above in table 3, the output of OR gate 340 on line 345 follows, after 2 rising clock edges, the state of input clock 225. This is true because the output of input select decoder, input select signal 215, is low and therefore OR gate 340 follows the Q output level of flip-flop 330, once input select signal 215 (low) propagates through the flip-flops 320, 330.

Re-synchronization circuit 310 is configured, in an embodiment, with flip-flops 320 and 330 that change output state Q ONLY on a rising edge of input clock 225. This design feature ensures that if input select signal 215 changes state in the middle of a clock cycle of input clock 225, the Q outputs 325 and 335 will not change until the next rising edge of input clock 225. Therefore, a change in input select signal 215 in the middle of a cycle of input clock 225 will not result in a shortening of the duty cycle of the re-synchronized clock signal 345 because no logic states will changes until a subsequent rising edge of input clock 225. As will be apparent, the delay can be extended or shortened by increasing or decreasing the number of flip-flops 320, 330.

Table 4 below shows, in an embodiment, the propagation of a clock signal applied to the clock input of re-synchronization circuit 310 and OR gate 340, when input select signal 215 transitions from high (disabled) to low (enabled). (Line 215 is the input state to flip-flop 320; line 325 is the Q output of flip-flop 320 and the input state to flip-flop 330; line 335 is the Q output of flip-flop 330 and the input state to OR gate 340; line 345 is the output state of OR gate 340.)

TABLE 4

| Clock State 225 | 215 | 325 | 335 | 345 |
|---|---|---|---|---|
| 0 | 1 | $Q_{prev}$ | $Q_{prev}$ | $Q_{prev}$ |
| 1 | 1 | 1 | $Q_{prev}$ | 1 |
| 0 | 1 | 1 | $Q_{prev}$ | $Q_{prev}$ |
| 1 | 1 | 1 | 1 | 1 |
| 0 | 1 | 1 | 1 | 1 |
| 1 | 1 | 1 | 1 | 1 |
| 0 | 1 | 1 | 1 | 1 |
| 1 | 1 | 1 | 1 | 1 |
| 0 | 0 | 1 | 1 | 1 |
| 1 | 0 | 0 | 0 | 1 |
| 0 | 0 | 0 | 0 | 0 |
| 1 | 0 | 0 | 0 | 1 |
| 0 | 0 | 0 | 0 | 0 |
| 1 | 0 | 0 | 0 | 1 |

As shown above in table 4, the output of OR gate 340 on line 345 follows the state of input clock 225, after 1 rising clock edge after input select signal 215 transitions from disabled to enabled.

Table 5 below shows, in an embodiment, the propagation of a clock signal applied to the clock input of re-synchronization circuit 310 and OR gate 340, when input select signal 215 transitions from low (enabled) to high (disabled). (Line 215 is the input state to flip-flop 320; line 325 is the Q output of flip-flop 320 and the input state to flip-flop 330; line 335 is the Q output of flip-flop 330 and the input state to OR gate 340; line 345 is the output state of OR gate 340.)

TABLE 5

| Clock State 225 | 215 | 325 | 335 | 345 |
|---|---|---|---|---|
| 0 | 0 | $Q_{prev}$ | $Q_{prev}$ | $Q_{prev}$ |
| 1 | 0 | 0 | $Q_{prev}$ | 1 |
| 0 | 0 | 0 | $Q_{prev}$ | $Q_{prev}$ |
| 1 | 0 | 0 | 0 | 1 |
| 0 | 0 | 0 | 0 | 0 |
| 1 | 0 | 0 | 0 | 1 |
| 0 | 0 | 0 | 0 | 0 |
| 1 | 0 | 0 | 0 | 1 |
| 0 | 1 | 0 | 0 | 0 |
| 1 | 1 | 1 | 1 | 1 |
| 0 | 1 | 1 | 1 | 1 |
| 1 | 1 | 1 | 1 | 1 |
| 0 | 1 | 1 | 1 | 1 |
| 1 | 1 | 1 | 1 | 1 |

As shown above in table 5, the output of OR gate 340 on line 345 remains high, after 1 rising clock edge after input select signal 215 transitions from enabled to disabled, thus masking the state of input clock 225.

AND gate 350 combines the output of OR gate 340 on line 345 with an output of another OR gate (not shown) from another re-synchronization circuit driven by a different input clock as will be discussed later in further detail.

Figure 4:
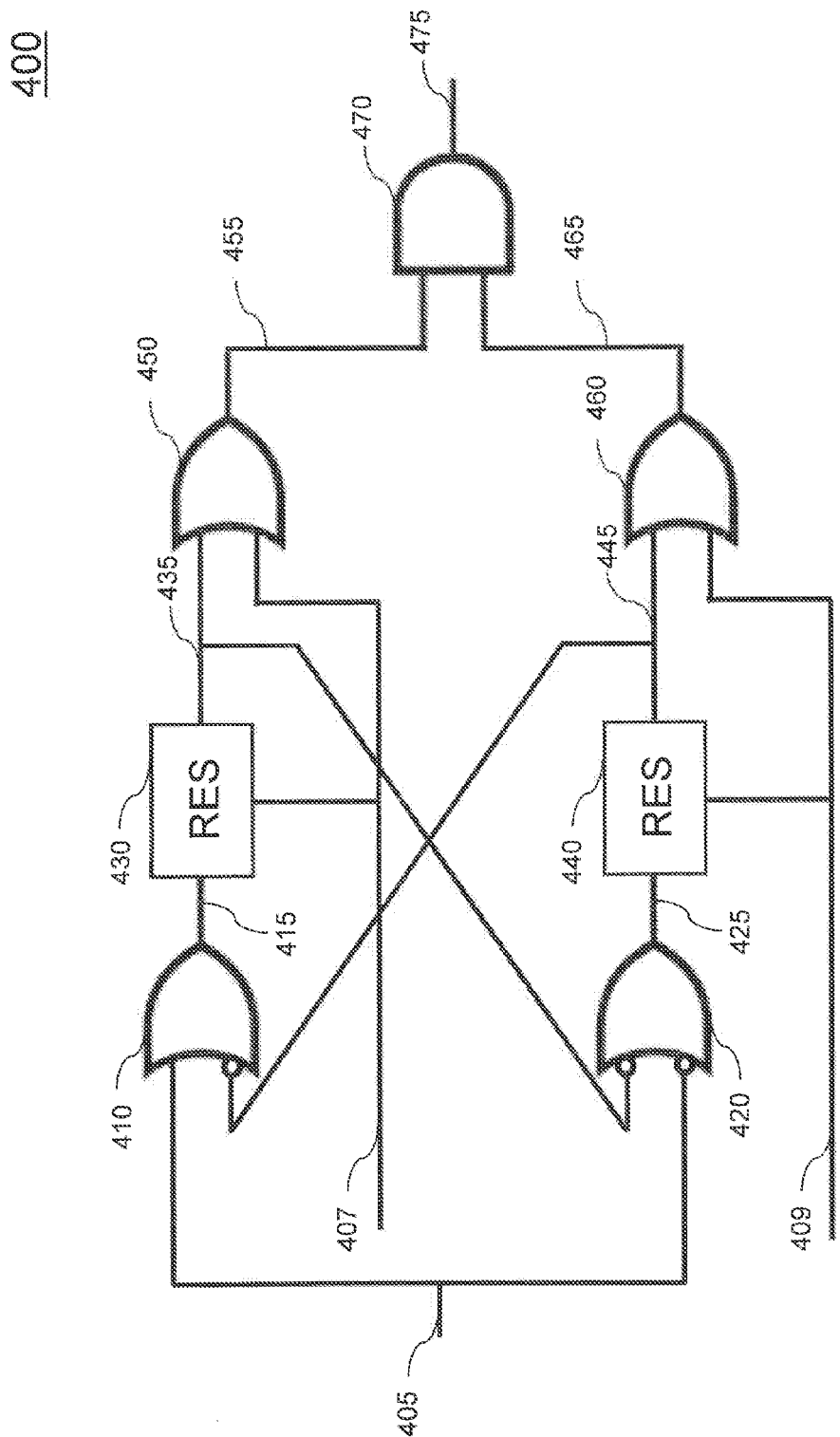
FIG. 4 illustrates a two input clock signal switching system with feedback, according to an embodiment.

FIG. 4 illustrates a two input clock signal switching system 400 with feedback, according to an embodiment. Two input clock signal switching system 400 builds upon clock switching system 300 discussed above in FIG. 3. Two input clock signal switching system 400 includes an OR gate 410 (with a single inverted input), an OR gate 420 (with both inputs inverted), re-synchronization circuits 430 and 440, OR gates 450 and 460, and output AND gate 470.

Clock signal switching system 400 selects between a first clock signal 407 and a second clock signal 409. Input select signal 405 dictates the selection of either first clock signal 407 or second clock signal 409. In an embodiment, input select signal 405 is inverted at the input of OR gate 420. Therefore, when input select signal 405 is low, input clock 407 is selected and input clock 409 is disabled. Conversely, when input select signal 405 is high, input clock 407 is disabled and input clock 409 is enabled.

OR gates 410 and 420 accept as an input, in addition to an input clock signal, the output of the re-synchronization circuit associated with the other input clock signal. In an embodiment, re-synchronization circuits 430 and 440 are configured in the same manner as re-synchronization circuit 310 discussed in reference to FIG. 3 where input signals 415 and 425 represent the input select signal. The effect of the feedback signal 435 from re-synchronization circuit 430, and the feedback signal 445 from re-synchronization circuit 440, is to ensure that only one of the input clock signals 407 or 409 can be active at any point in time. Feedback signals 435 and 445, by design, are synchronized with each other.

For example, if input select signal 405 is low, thus enabling input clock 407, the steady state level of the output of re-synchronization circuit 440 (RES output 445) is a constant high. Since RES output 445 is high, the output of OR gate 460 (output 465) will always be high, thus effectively masking input clock signal 409, similar to that described above for FIG. 3.

Further, the high state of RES output 445 is fed back to the input of OR gate 410 where it is inverted to low. Thus, the output signal 415 of OR gate 410 is always low, thus enabling the input select signal to RES 430 where the output of OR gate 450 (re-synchronized clock signal 455) will follow the state of input clock 407.

Conversely, if input select signal 405 is high, the opposite results occur where the input clock signal 407 is masked and the re-synchronized clock signal 465 will follow the state of input clock 409. Since output 455 or 465 is high when the respective RES system is enabled, AND gate 470 will pass the re-synchronized clock signal of the enabled RES system as output 475.

Figure 5:
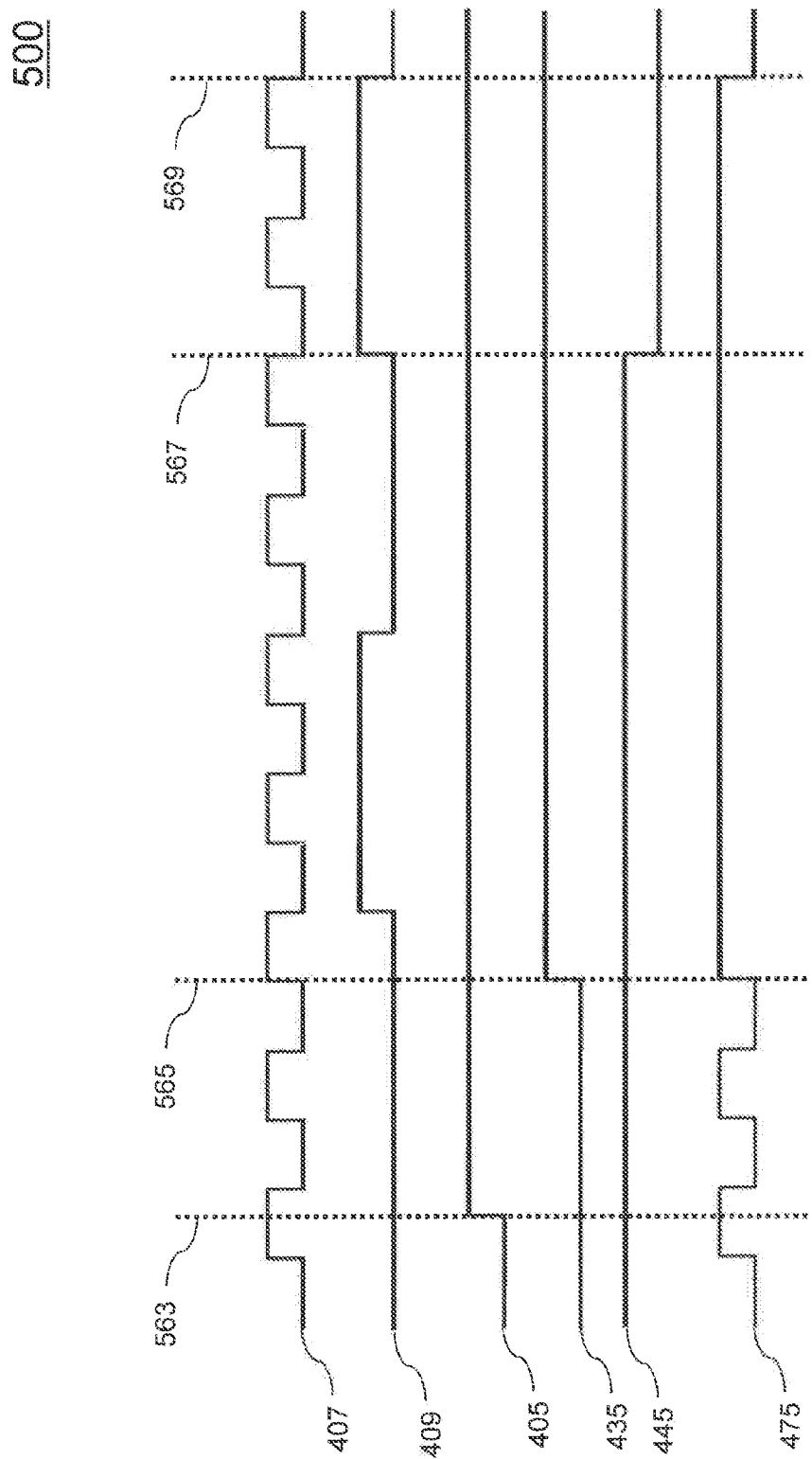
FIG. 5 illustrates a set of timing diagrams for a two input clock signal switching system with feedback, according to an embodiment.

FIG. 5 illustrates a system-timing diagram 500 of a two input clock signal switching system with feedback, e.g., clock signal switching system 400, according to an embodiment. System-timing diagram 500 includes timing diagram 407 representing first clock signal 407, timing diagram 409 represents second clock signal 409, timing diagram 405 represents input select signal 405, timing diagram 435 represents feedback signal 435 from re-synchronization circuit 430, timing diagram 445 represents feedback signal 445 from re-synchronization circuit 440, and timing diagram 475 represents clock switching system output 475. System-timing diagram 500 also includes time mark 563 indicating when input select 405, which is active low, transitions to a high, disabled, state. Time mark 565 represents the second rising edge of first input clock 407 after the change in state of input select 405. Time mark 567 represents the second rising edge of second input clock 409 after the change in state of input select 405. Time mark 569 represents the falling edge of second input clock 409 after time mark 567.

System-timing diagram 500 illustrates switching from first clock signal 407 to second clock signal 409 by changing the state of input select signal 405 initiated at time mark 563. Note that output 475 matches first clock signal 407 for the first two cycles of first clock signal 407. In addition, notice that although input select 405 changes states in the middle of a clock cycle of first clock signal 407 at time mark 563, output 475 does not show any type of a shortened duty cycle due to the design of the re-synchronization circuits as discussed above.

After two cycles of first clock signal 407 from time mark 563, the change of state of input select signal 405 has propagated through re-synchronization circuit 430 and at time mark 565 feedback signal 435 goes high. Since re-synchronization circuit 440 is now enabled, two clock cycles, e.g., two rising edges, of second clock signal 409 are required to propagate second clock signal 409 through re-synchronization circuit 440 before out 475 follows input clock 409. At time mark 567, output 475 matches the state of second clock signal 409 and will continue to output the re-synchronized signal 465 through output 475 until a subsequent change in the state of input select 405. Note that output signal 475 is held high between time mark 565 and 567. This is a design choice of this embodiment, but can be modified to hold at a low state. However, in any case, the output 475 does not contain a pulse having a lower duty cycle than any one of the input clocks, thus eliminating the glitch problem previously discussed.

Figure 6:
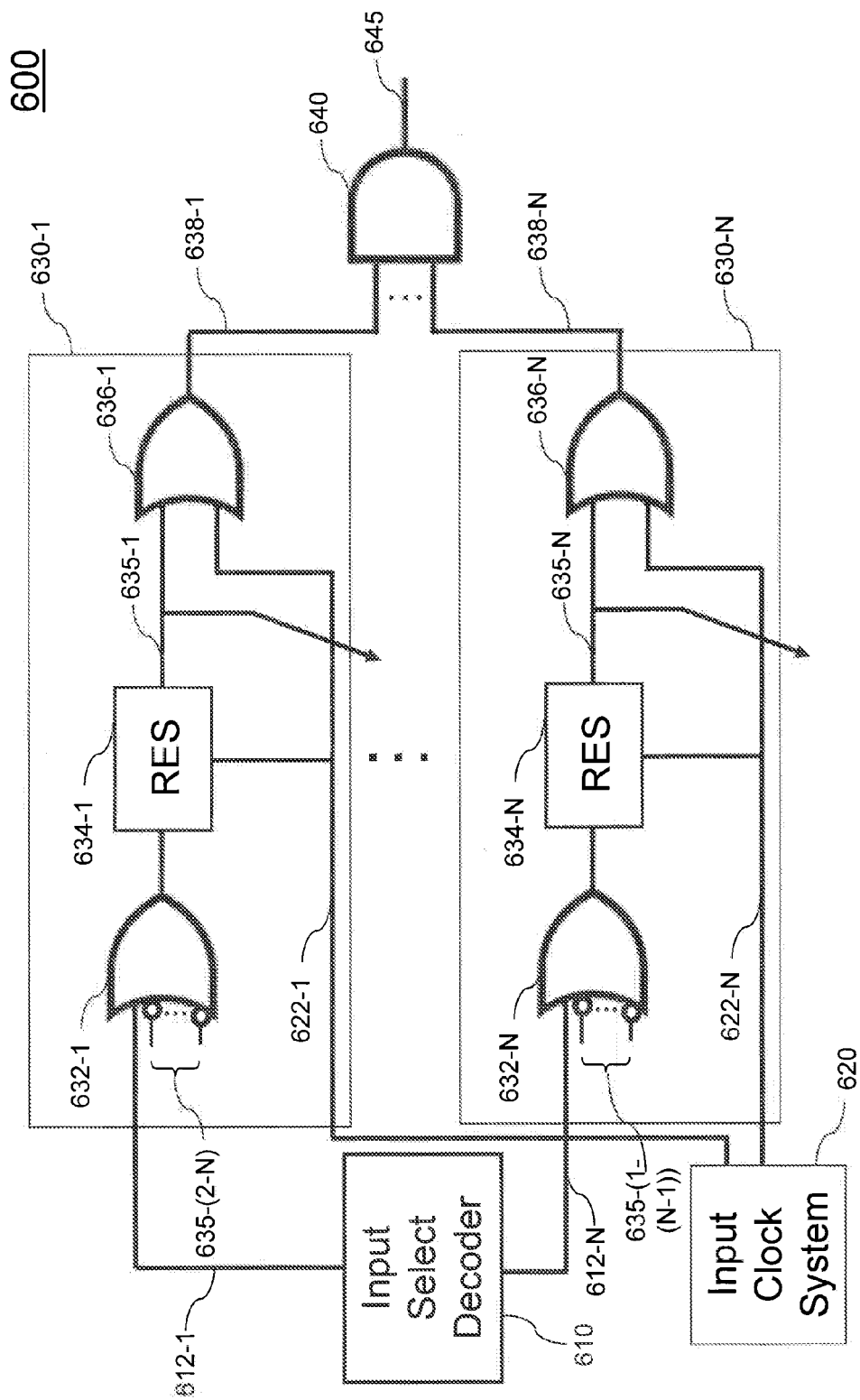
FIG. 6 illustrates a functional design of a scalable clock switching system, according to an embodiment.

FIG. 6 illustrates a functional design of a scalable clock switching system 600, according to an embodiment. Scalable clock switching system 600 includes an input select decoder 610, an input clock circuit 620, re-synchronization circuit modules 630-1 through 630-N, and an N input AND output gate 640.

Scalable clock switching system 600 is similar to clock signal switching system 400 with feedback, except that the design has been modified so that re-synchronization circuit modules 630 are identical. Each re-synchronization circuit module 630 includes an N input OR gate 632, a re-synchronization circuit 634, and a two input OR gate 636. Scalable clock switching system 600 can have two or more re-synchronization circuit modules, with no imposed upper limit as to the number of modules.

Each N input OR gate 632 receives one of its inputs from the output of input select decoder 610 over line 612. Input select decoder 610 selects only one re-synchronization circuit module 630 to be active at any one time. In the example shown in FIG. 6, a re-synchronization circuit module 630 is selected when its input select line 612 goes to low, and all others remain high. In an embodiment, this select signal can be configured to be an active high. The other N−1 inputs to OR gate 632 consist of a feedback signal 635 from each of the other N−1 re-synchronization modules 630. Thus, OR gate 632-1 would receive feedback signals 635-2 through 635-N from re-synchronization modules 630-2 through 630-N, in addition to its input select signal 612-1. Each of the feedback signals 635-2 through 635-N is inverted at OR gate 632-1. Therefore, as discussed in reference to FIG. 4, only one re-synchronization module can be active at any given time.

N input AND gate 640 combines the outputs from each of the re-synchronization circuit modules 630-1 through 630-N. Each non-selected re-synchronization circuit modules 630 generates a high signal from its OR gate 636 on its line 638. The selected re-synchronization circuit module 630 generates a re-synchronized input clock signal. Therefore, output AND gate 640 generates output 645 that follows the selected re-synchronized input clock signal, as the AND gate output will only produce a high when all inputs are high, hence following the clock cycle of the selected re-synchronized input clock signal.

Method

Figure 7:
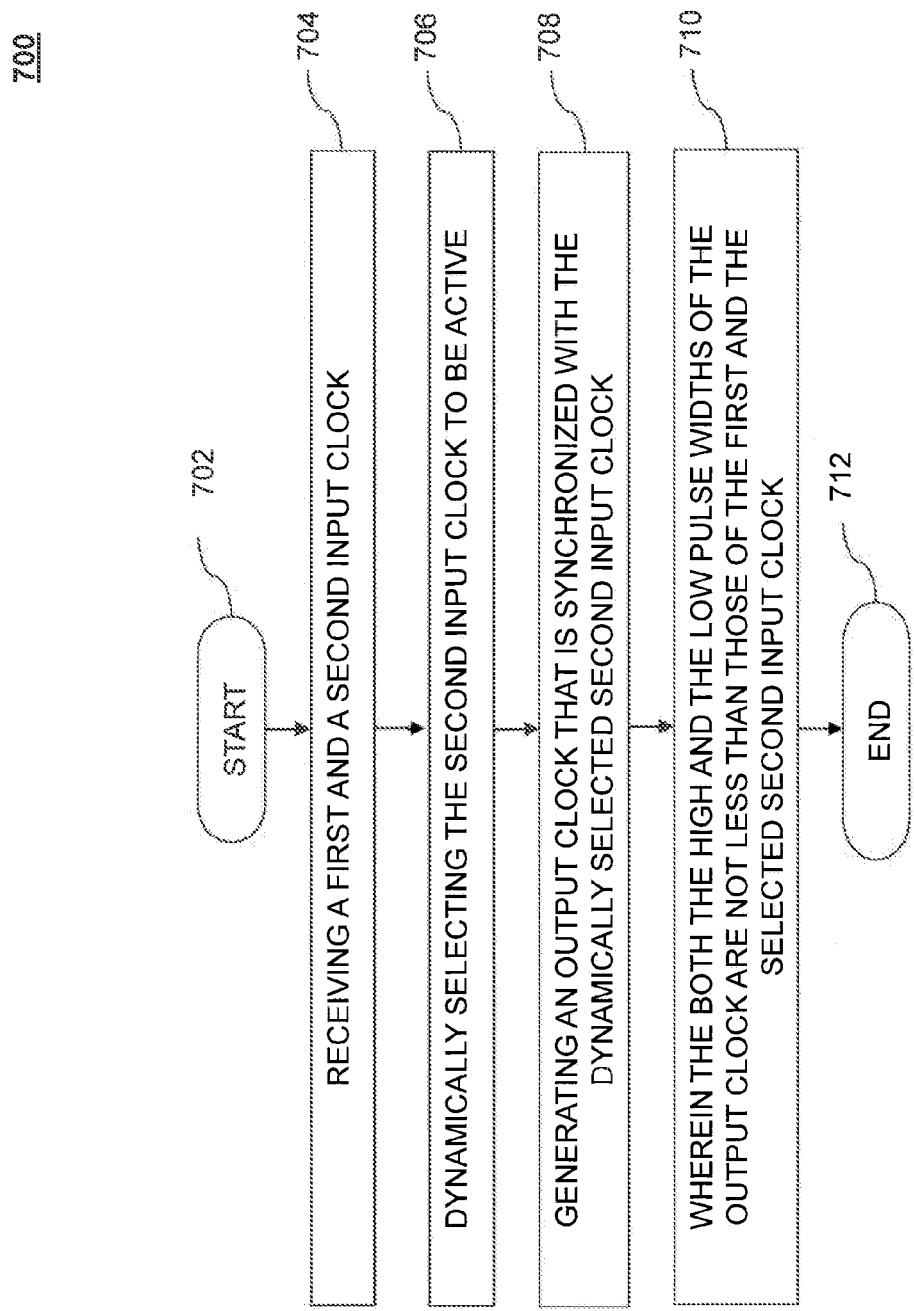
FIG. 7 illustrates a method of clock switching, according to an embodiment.

FIG. 7 illustrates a method 700 of clock signal switching, according to an embodiment. In the example shown in FIG. 7, the method starts with step 702. In step 704, a first input clock signal and a second input clock signal are received. For example, FIG. 2 illustrates a functional design of clock switching system 200 with an input clock circuit 220, where input clock circuit 220 generates and/or controls a first and second input clock signal. Further, first and second input clock signals do not have to be of the same duty cycle, frequency, amplitude or any other signal characteristic.

In step 706, a dynamic selection is made of an input clock signal. In an example, the second input clock is selected to be active. FIG. 2 illustrates input select decoder 210 that controls which re-synchronization circuit is active, e.g., re-synchronization circuit 230-1 through 230-N, where N is an integer value of two or greater. Only one re-synchronization circuit can be active, e.g., in control, at any one time, which can also be referred to as an onecool disable. Input select decoder 210 can also be characterized as a disable controller, disabling all re-synchronization circuits 230 except for one re-synchronization circuit 230 that is active.

In step 708, an output clock is generated that is synchronized with the dynamically selected second input clock. For example, FIG. 2 illustrates re-synchronization circuit 230 that controls whether a clock signal on line 225 is active or masked. If a re-synchronization circuit 230 is selected by input select decoder 210, such as the second re-synchronization circuit associated with the second input clock, re-synchronization circuit 230 will re-synchronize the second input clock signal.

In step 710, the re-synchronized output clock is made such the duty cycle of the output clock is not less than the duty cycle of the selected second input clock. For example, FIG. 2 illustrates re-synchronization of an input clock signal where an associated output clock signal is generated that is in-sync with the input clock signal and where the duty cycle of the output clock signal is not less than that of the corresponding input clock signal. Such re-synchronizing eliminates the generation of glitches as described above.

In step 712, the method is concluded.

Conclusion

Embodiments described herein provide methods and apparatus for the glitch-free clock switching. The summary and abstract sections may set forth one or more but not all exemplary embodiments as contemplated by the inventors, and thus, are not intended to limit the present invention and the claims in any way.

The embodiments herein are described above with the aid of functional building blocks illustrating the implementation of specified functions and relationships thereof. The boundaries of these functional building blocks are arbitrarily defined herein for the convenience of the description. Alternate boundaries may be defined so long as the specified functions and relationships thereof are appropriately performed.

The foregoing description of the specific embodiments will so fully reveal the general nature of the invention that others may, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the claims and their equivalents.

What is claimed is:

1. A clock switching system, comprising:
a first re-synchronization circuit configured to receive a first input clock;
a first OR gate logic circuit configured to receive the first input clock and an output from the first re-synchronization circuit;
a second re-synchronization circuit configured to receive a second input clock;
a second OR gate logic circuit configured to receive the second input clock and an output from the second re-synchronization circuit;
an input select decoder coupled to the first re-synchronization circuit and the second re-synchronization circuit, configured to dynamically select either the first or the second input clock to be active;
a feedback controller configured to:
feedback an output of the first re-synchronization circuit back into an input of the second re-synchronization circuit, and
feedback an output of the second re-synchronization circuit back into an input of the first re-synchronization circuit,
a third OR gate logic circuit configured to receive the output feedback from the second re-synchronization circuit and an output from the input select decoder; and
a fourth OR gate logic circuit configured to receive the output feedback from the first re-synchronization circuit and the output from the input select decoder;
wherein upon being dynamically selected the re-synchronization circuit associated with the selected input clock generates an output clock synchronized with the selected input clock,
wherein both a high pulse width and a low pulse width of the output clock are not less than those of the selected input clock,
wherein the feedback of the output of the first re-synchronization circuit is synchronized with the feedback of the output of the second re-synchronization circuit, and
wherein the first input clock into the first re-synchronization circuit, and the second input clock into the second re-synchronization circuit, are not inverted.

2. The system of claim 1, further comprising an input clock circuit configured to generate a plurality of input clocks.

3. The system of claim 2, wherein the plurality of input clocks comprise clocks having at least two different duty cycles.

4. The system of claim 1, wherein the feedback controller allows only a single input clock to be active by masking outputs of all non-active input clocks.

5. The system of claim 4, wherein the first re-synchronization circuit comprises a first set of dual flip-flop circuit elements and the second re-synchronization circuit comprises a second set of dual flip-flop circuit elements.

6. The system of claim 5, wherein the first set of dual flip-flop circuit elements are triggered by a positive edge of the first input clock and the second set of dual flip-flop circuit elements are triggered by a positive edge of the second input clock.

7. The system of claim 1, wherein the feedback controller is configured to receive an output from the first and second re-synchronization circuits and synchronously produce a feedback control signal.

8. A method for clock signal switching, comprising:
receiving a first and a second input clock;
generating a first feedback signal from a first re-synchronization circuit based on the first input clock;
receiving the first input clock and an output from the first re-synchronization circuit by a first OR gate logic circuit;
generating a second feedback signal from a second re-synchronization circuit based on the second input clock;
receiving the second input clock and an output from the second re-synchronization circuit by a second OR gate logic circuit;
receiving the second feedback signal from the second re-synchronization circuit and an output from an input select decoder by a third OR gate logic circuit;
receiving the first feedback signal from the first re-synchronization circuit and an output from the input select decoder by a fourth OR gate logic circuit;
dynamically selecting the second input clock to be active based on the first feedback signal; and
generating an output clock that is synchronized with the dynamically selected second input clock,
wherein both a high pulse width and a low pulse width of the output clock are not less than those of the selected second input clock, and
wherein the first input clock into the first re-synchronization circuit, and the second input clock into the second re-synchronization circuit, are not inverted.

9. The method of claim 8, further comprising generating an output clock that is synchronized with the first input clock prior to the dynamic selecting of the second input clock to be active.

10. The method of claim 9, wherein the generation of the synchronized output clock that is synchronized with the dynamically selected second input clock is delayed from the time of dynamically selecting the second input clock.

11. The method of claim 10, wherein the delay is equal to two clock cycles of the first input clock and two clock cycles of the second input clock.

12. The method of claim 8, wherein dynamically selecting the second input clock comprises masking the first input clock.

13. The method of claim 8, further comprising generating the first and second input clock.

14. The method of claim 13, wherein the first and second input clock have different duty cycles.

15. The method of claim 13, further comprising stopping the first or second input clock by putting the first or second input clock into a standby mode.

16. The method of claim 15, further comprising waking the first or second input clock prior to being dynamically selected.

17. The method of claim 8, further comprising allowing only a single input clock to be active by masking outputs of all non-active input clocks.

18. The method of claim 8, wherein generating the output clock that is synchronized with the dynamically selected second input clock is based on a plurality of rising edges of the first and second input clocks.

* * * * *